(12) United States Patent
Huang et al.

(10) Patent No.: US 7,098,124 B2
(45) Date of Patent: Aug. 29, 2006

(54) METHOD OF FORMING CONTACT HOLE AND METHOD OF FABRICATING SEMICONDUCTOR DEVICE

(75) Inventors: Min-San Huang, Hsinchu (TW); Leon Lai, Hsinchu (TW); Pin-Yao Wang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/908,871

(22) Filed: May 31, 2005

(65) Prior Publication Data
US 2006/0134910 A1   Jun. 22, 2006

(30) Foreign Application Priority Data
Dec. 21, 2004   (TW) .............................. 93139778 A

(51) Int. Cl.
*H01L 21/44* (2006.01)
*H01L 21/4763* (2006.01)

(52) U.S. Cl. .................. 438/597; 438/589; 438/592; 438/303; 438/304; 438/618; 438/637; 438/595; 251/E21.384

(58) Field of Classification Search ............... 438/597, 438/672, 637, 618, 381, 589, 592, 303, 304
See application file for complete search history.

(56) References Cited

U.S. PATENT DOCUMENTS

| 5,744,395 | A | * | 4/1998 | Shue et al. ................. 438/305 |
| 5,926,709 | A | * | 7/1999 | Aisou et al. ................ 438/253 |
| 6,087,710 | A |   | 7/2000 | Eimori et al. ............... 257/649 |
| 6,124,192 | A | * | 9/2000 | Jeng et al. .................. 438/597 |

* cited by examiner

*Primary Examiner*—Michael Lebentritt
*Assistant Examiner*—Mohsen Ahmadi
(74) *Attorney, Agent, or Firm*—Jianq Chyun IP Office

(57) ABSTRACT

A method of forming contact holes is provided. A substrate having a plurality of device structures is provided. A first dielectric layer and a conductive layer sequentially cover the device structures and the surface of the substrate. A recess is formed in the conductive layer between every two neighboring device structures. A pair of composite spacers is formed in the recess. By using the composite spacers as a mask, a portion of the exposed conductive layer is removed to form a plurality of openings between every two neighboring device structures. A second dielectric layer is then formed on the sidewalls of the openings. A third dielectric layer is formed over the substrate. Portions of the third dielectric layer and the first dielectric layer above the openings are removed to form a plurality of self-aligned contact holes.

28 Claims, 4 Drawing Sheets

METHOD OF FORMING CONTACT HOLE AND METHOD OF FABRICATING SEMICONDUCTOR DEVICE

CROSS-REFERENCE TO RELATED APPLICATION

This application claims the priority benefit of Taiwan application serial no. 93139778, filed Dec. 21, 2004. All disclosure of the Taiwan application is incorporated herein by reference.

BACKGROUND OF THE INVENTION

1. Field of the Invention

The present invention relates to a semiconductor process, and more particularly, to a method of forming a contact hole and a method of fabricating a semiconductor device.

2. Description of the Related Art

The technology of the present Ultra-Large Semiconductor Integrated (ULSI) circuit has developed under 0.18-μm. In other words, the metal and semiconductive contacts are to be smaller and smaller. Therefore, how to overcome misalignment of contact resulting from the small line widths is an important issue in the semiconductor industry.

In order to overcome the smaller line width and prevent misalignment of the contacts, self-aligned contact (SAC) design has been widely adopted in fabricating semiconductor device processes. The SAC technique can also be used to electrically connect doped regions in the substrate and the conductive lines over the substrate.

FIGS. 1A–1D are schematic cross sectional views showing progression of a prior art SAC process.

Referring to FIG. 1A, a substrate 100 is provided. A source region 108 is formed in the substrate 100. A trench-type gate structure 102 is partially formed in the substrate 100. A silicon oxide dielectric layer 104 and a polysilicon conductive layer 106 are sequentially formed over the gate structure 102 and the surface of the substrate 100. A silicon nitride spacer material layer 110 is then formed over the conductive layer 106.

Referring to FIG. 1B, an anisotropic etch process is performed to remove a portion of the spacer material layer 110 so as to form spacers 110a on the sidewalls of the conductive layer 106 of the gate structure 102. By using the spacers 110a as a mask, the exposed conductive layer 106 is removed to form openings 112 in the conductive layer 106 between every two neighboring gate structures 102. Drain regions 114 are then formed in the substrate 100 at the bottoms of the openings 112.

Referring to FIG. 1C, a silicon nitride dielectric layer 116 is then formed on the sidewalls of the conductive layers 106a of the openings 112. A dielectric layer 118 is formed over the substrate 100.

Referring to FIG. 1D, portions of the dielectric layer 118 and dielectric layer 104 at the bottoms of the openings 112 are removed to form a plurality of self-aligned contact holes 120, and the dielectric layers 104a and 118a. Conductive plugs 122 are formed in the self-aligned contact holes 120.

Because of the low etching selectivity, about 10, of the polysilicon conductive layer 106 to the silicon nitride spacer material 110, the silicon nitride spacer material 110 adjacent to the openings 112 (area 124 in FIG. 1B) is gradually removed during the step of forming the openings 112. As a result, the spacer material layer 110 is thinner than the other areas. In the subsequent step of forming the self-aligned contact holes 120, the spacers 110a at the area 124 cannot effectively protect the conductive layers 106a thereunder and exposes the conductive layers 106a as shown in FIG. 1D. A subsequent process of forming conductive plugs will short the conductive plugs and the exposed conductive layers 106a. Accordingly, device performances are affected.

SUMMARY OF THE INVENTION

Accordingly, the present invention is directed to a method of forming a contact hole and a method of fabricating a semiconductor device. The methods of the present invention solve the device short issue caused by the low etching selectivity of the polysilicon conductive layer to the silicon nitride spacers in prior art technology in which the spacers cannot effectively protect the conductive layer.

The present invention provides a method of forming a contact hole. The method first provides a substrate. A plurality of device structures is formed over the substrate. A first dielectric layer and a conductive layer are sequentially formed over the device structures and the surface of the substrate. The conductive layer includes a recess between every two neighboring device structures. A pair of composite spacers is formed in the recess. The composite spacers include a spacer material layer and a spacer protection layer disposed over the spacer material layer. An etching selectivity of the conductive layer to the spacer protection layer is larger than an etching selectivity of the conductive layer to the spacer material layer. A portion of the conductive layer is then removed by using the composite spacers as a mask to form a plurality of openings that expose the substrate in the conductive layer between the neighboring device structures. A second dielectric layer is formed on sidewalls of the openings. A third dielectric layer is formed over the substrate, and the third dielectric layer covers the device structures and the conductive layer. A portion of the third dielectric layer and the first dielectric layer above the openings are removed to form a plurality of self-aligned contact holes.

In the present invention, the etching selectivity of the conductive layer to the spacer protection layer is larger than that of the conductive layer to the spacer material layer. Accordingly, during the process of forming the openings, the spacer protection layer disposed over the spacer material layer can effectively prevent the spacer material layer from the etch process. The composite spacers adjacent to the openings still have an enough thickness. In the subsequent process for forming the self-aligned contact holes, the thick composite spacers can protect the conductive layer from the etch process, and the device short issue can be avoided.

The present invention provides a method of fabricating a semiconductor device. The method first provides a substrate. A plurality of device structures is formed over the substrate. A first dielectric layer and a conductive layer sequentially cover the device structures and the surface of the substrate. A plurality of first doped regions is formed at the bottom of the device structures. The conductive layer includes a recess between every two neighboring device structures. A pair of composite spacers is formed in the recess. The composite spacers include a spacer material layer and a spacer protection layer disposed over the spacer material layer. An etching selectivity of the conductive layer to the spacer protection layer is larger than an etching selectivity of the conductive layer to the spacer material layer. A portion of the conductive layer is removed by using the composite spacers as a mask to form a plurality of openings to expose the substrate in the conductive layer between the neighboring device structures. A plurality of second doped regions is formed in the substrate at the bottom of the openings. A second dielectric layer is formed on sidewalls of the openings. A third dielectric layer is formed over the substrate, and the third dielectric layer covers the device structures and the conductive layer. A portion of the third dielectric layer and the first dielectric layer above the openings are removed to form a plurality of self-aligned contact holes. A plurality of conductive plugs is formed in the self-aligned contact holes.

In the present invention, the etching selectivity of the conductive layer to the spacer protection layer is larger than that of the conductive layer to the spacer material layer. Accordingly, during the process of forming the openings, the spacer protection layer disposed over the spacer material layer can effectively prevent the spacer material layer from the etch process. The composite spacers adjacent to the openings still have an enough thickness. In the subsequent process for forming the self-aligned contact holes, the thick composite spacers can protect the conductive layer from the etch process, and the device short issue can be avoided.

The above and other features of the present invention will be better understood from the following detailed description of the preferred embodiments of the invention that is provided in communication with the accompanying drawings.

DESCRIPTION OF EMBODIMENTS

FIGS. 2A–2E are schematic cross sectional views showing progress of a method of fabricating a semiconductor device according to an embodiment of the present invention.

Figure 1A:
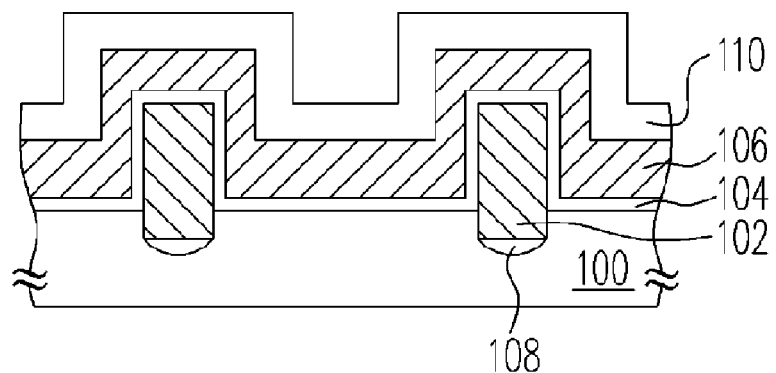
FIGS. 1A–1D are schematic cross sectional views showing progression of a prior art SAC process.
Figure 1B:
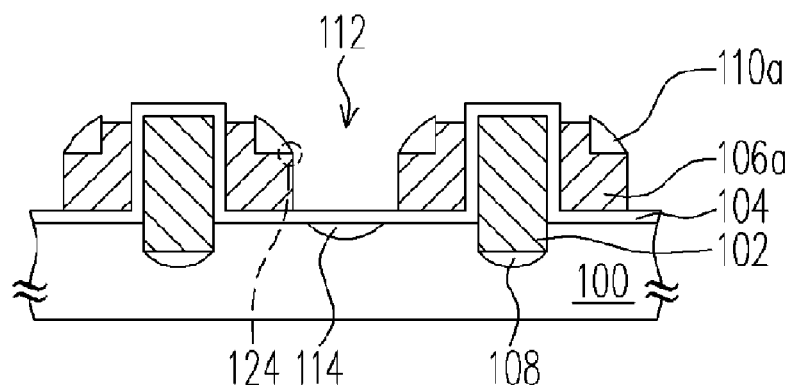
Figure 1C:
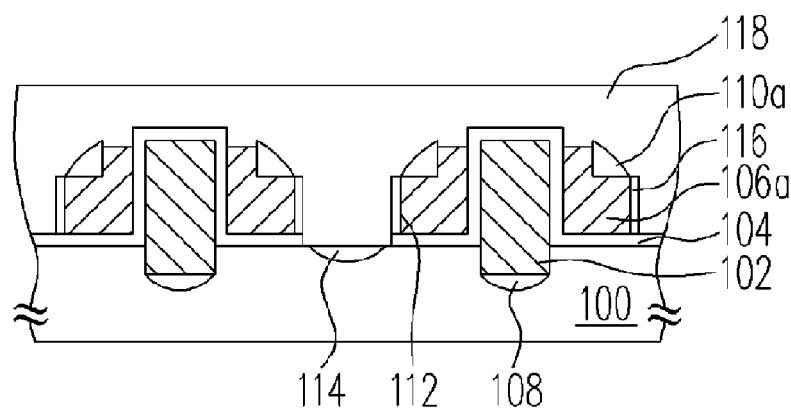
Figure 1D:
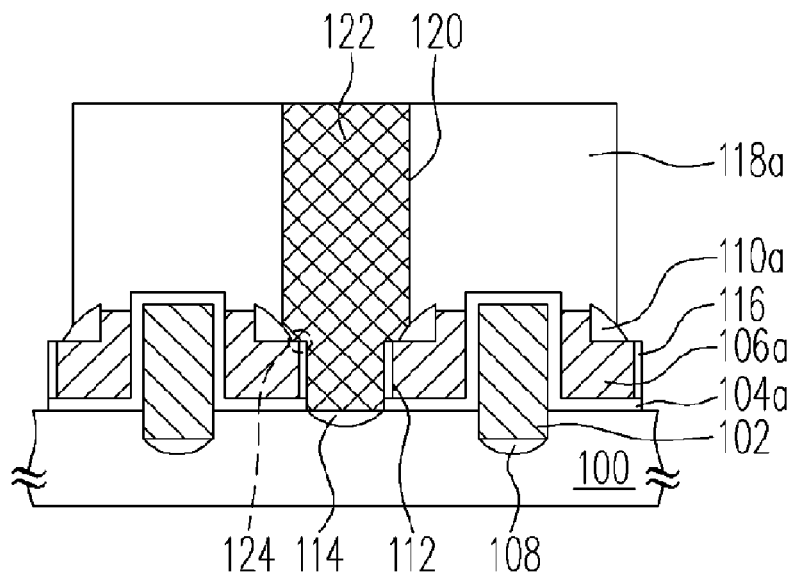
Figure 2A:
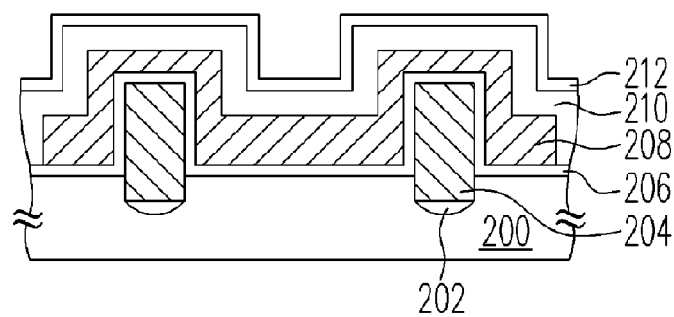
FIGS. 2A–2E are schematic cross sectional views showing progress of a method of fabricating a semiconductor device according to an embodiment of the present invention.

Referring to FIG. 2A, plural source regions 202 are formed in the substrate 200, and plural device structures 204 are formed over the source regions 202. Wherein, the method of forming the source regions 202 can be an ion implantation method, for example. In addition, the device structures 204 can be trench-type structures partially formed in the substrate 200, or the device structures (not shown) formed over the surface of the substrate 200. Further, the device structures 204 can be gate structures or conductive line structures. Wherein, the gate structure includes, for example, at least one dielectric layer and a gate layer; and the conductive line structure includes, for example, at least one conductive layer. A dielectric layer 206 and a conductive layer 208 are then sequentially formed over the device structures 204 and the surface of the substrate 200. Wherein, the material of the dielectric layer 206 can be, for example, silicon oxide, silicon oxide/silicon nitride/silicon oxide, or other suitable materials. In addition, the material of the conductive layer 208 can be, for example, polysilicon, doped polysilicon, or other suitable materials which can be formed by a chemical vapor deposition (CVD) method, for example.

Referring to FIG. 2A, a spacer material layer 210 is formed over the conductive layer 208. The material of the spacer material layer 210 can be, for example, silicon nitride, and has a thickness about 500 Å. A spacer protection layer 212 is then formed over the spacer material layer 210. The material of the spacer protection layer 212 can be, for example, silicon oxide which can be formed by a CVD method with Tetra-Ethyl-Ortho-Silicate (TEOS) as a reaction gas. The thickness of the silicon oxide layer is about 200 Å.

Note that the etching selectivity of the conductive layer 208 to the spacer protection layer 212 is larger than that of the conductive layer 208 to the spacer material layer 210. In the subsequent process of etching the conductive layer 208, the spacer protection layer 212 can be more effectively resistant in the etching process than the spacer material layer 210. In a preferred embodiment, the etching selectivity of the conductive layer 208 to the spacer protection layer 212 is for example from 40 to 140. The etching selectivity of the conductive layer 208 to the spacer material layer 210 is from 5 to 20. The etching selectivity of the spacer material layer 210 to the spacer protection layer 212 is from 2 to 28. For example, the etching selectivity of the conductive layer 208 to the spacer protection layer 212 is about 50, and the etching selectivity of the conductive layer 208 to the spacer material layer 210 is about 10.

Figure 2B:
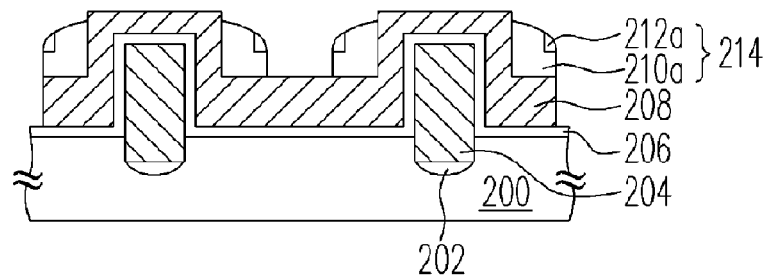

Referring to FIG. 2B, portions of the spacer protection layer 212 and the spacer material layer 210 are removed to form a plurality of composite spacers 214 on the sidewalls of the conductive layer 208 of the device structure 204. Wherein, the composite spacers 214 are composed of the remaining spacer protection layers 212a and the remaining spacer material layers 210a. In an embodiment, in the composite spacer 214, the spacer protection layer 212a is formed in a recess of the spacer material layer 210a. In addition, the method of removing the portions of the spacer protection layer 212 and the spacer material layer 210 can be, for example, an anisotropic etch process.

Figure 2C:
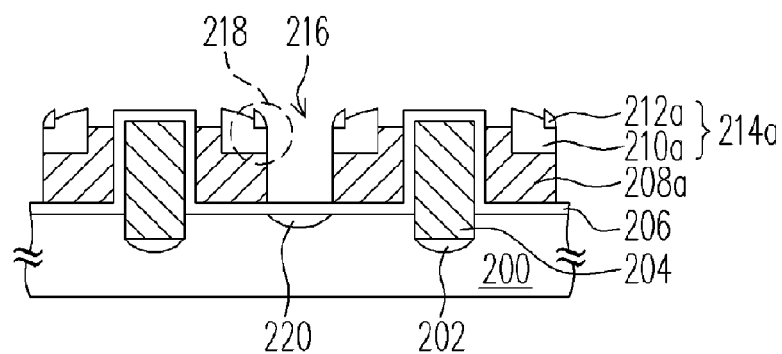

Referring to FIG. 2C, the exposed conductive layer 208 is removed by using the composite spacers 214a as a mask to form a plurality of openings 216 that expose the substrate 200 in the conductive layer 208a between every two neighboring device structures 204. In addition, during the removing process, the conductive layer 208 on the top of the device structure 204 is also removed.

Note that the etching selectivity of the conductive layer 208 to the spacer protection layer 212 is larger than that of the conductive layer 208 to the spacer material layer 210. In the step of forming the openings 216, the spacer protection layer 212 disposed over the spacer material layer 210 can effectively prevent the etching process. Accordingly, the composite spacers 214a adjacent to the openings 216, i.e., the areas 218, have an enough thickness.

A plurality of lightly doped regions 220 is formed in the substrate 200 at the bottom of the openings 216. The method of forming the lightly doped regions 220 can be, for example, an ion implantation method.

Figure 2D:
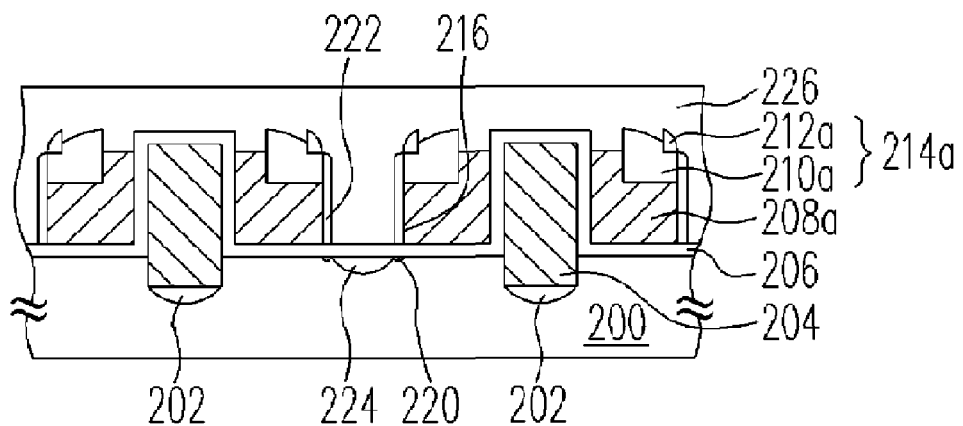

Referring to FIG. 2D, a dielectric layer 222 is formed on the sidewalls of the openings 216. The material of the dielectric layer 222 can be, for example, silicon nitride. The method of forming the silicon nitride includes, for example, forming a dielectric material layer (not shown) over the substrate 200 and performing an anisotropic etch process to form the dielectric material layer on the sidewalls of the openings 216.

After forming the dielectric layer 222, the method forms a plurality of heavily doped regions 224 in the lightly doped regions 220 to form drain regions.

A dielectric layer 226 is then formed over the substrate 200, covering the device structures 204 and the conductive layers 208a. The material of the dielectric layer 226 can be, for example, silicon nitride, silicon oxide, silicon oxynitride, or other suitable dielectric materials. The dielectric layer 226 can be formed by a CVD method, for example.

Figure 2E:
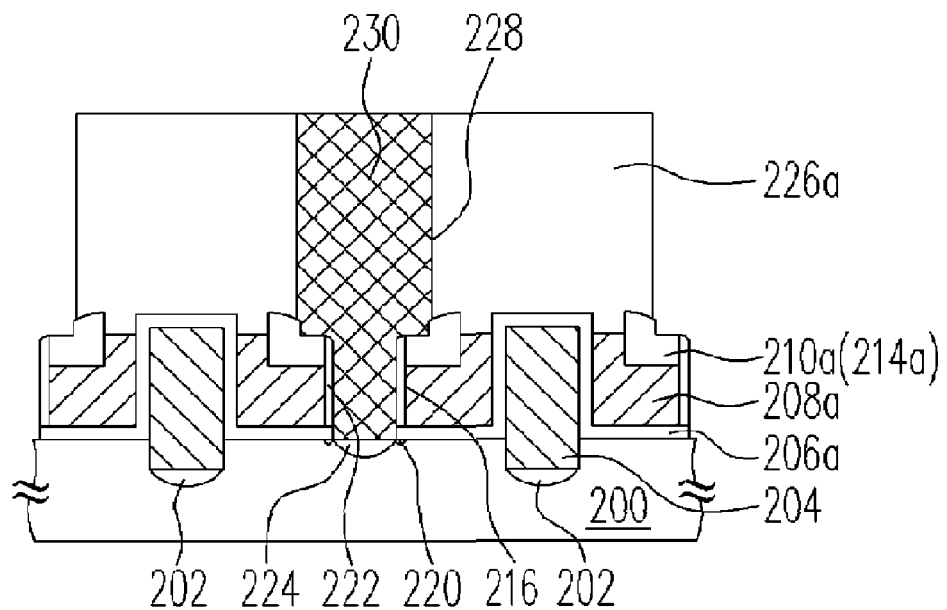

Referring to FIG. 2E, portions of the dielectric layer 226 and the dielectric layer 206 above the openings 216 are removed to form a plurality of self-aligned contact holes 228 and dielectric layers 206a. The method of removing the portions of the dielectric layer 226 and the dielectric layer 206 above the openings 216 can be, for example, an anisotropic etch process by using composite spacers 214a as a mask.

Note that the composite spacers 214a adjacent to the dielectric layer 222 are thick. During the process of forming the self-aligned contact holes 228, the thick composite spacers 214a provide a desired protection for the conductive layers 208 thereunder. Accordingly, the device short issue can be avoided. Besides, even though the space protection layer 212a and the dielectric layer 226 are same material, the spacer protection layers 212a are removed during the step of forming the self-aligned contact holes 228, the conductive layers 208 will not be exposed because of the thickness of the spacer material layers 210a underneath.

Then, a plurality of conductive plugs 230 is formed in the self-aligned contact holes 228. Wherein, the material of the conductive plugs 230 can be, for example, polysilicon, doped polysilicon or other suitable materials. The method of forming the conductive plugs 230 includes, for example, forming a conductive material layer (not shown) over the substrate 200 and at least filling the self-aligned contact holes 228. The conductive material layer outside the self-aligned contact holes 228 is then removed. The method of removing the conductive material layer can be an etch process, for example.

Accordingly, the present invention has the following advantages:

1. In the present invention, the etching selectivity of the conductive layer to the spacer protection layer is larger than that of the conductive layer to the spacer material layer. During the process of forming the openings, the spacer protection layer disposed over the spacer material layer can effectively prevent the etch process. As a result, the composite spacers adjacent to the openings are thick.

2. During the step of forming the self-aligned contact holes, because the composite spacers are thick according to the present invention, they can protect the conductive layer thereunder from the etch process. Accordingly, the device short issue can be avoided.

3. Though the trench-type structures are used as the embodiment of the present invention, the present invention, however, is not limited thereto. Applications of other device structures formed over the surface of the substrate are also included in the scope of the present invention.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method of forming a contact hole, comprising:
providing a substrate, a plurality of device structures being formed over the substrate, a first dielectric layer and a conductive layer being sequentially formed over the device structures and a surface of the substrate, the conductive layer comprising a recess between every two neighboring device structures;
forming a pair of composite spacers in the recess, the composite spacers comprising a spacer material layer and a spacer protection layer disposed over the spacer material layer, an etching selectivity of the conductive layer to the spacer protection layer being larger than an etching selectivity of the conductive layer to the spacer material layer;
removing a portion of the conductive layer by using the composite spacers as a mask to form a plurality of openings that expose the substrate in the conductive layer between the neighboring device structures;
forming a second dielectric layer on sidewalls of the openings;
forming a third dielectric layer over the substrate, the third dielectric layer covering the device structures and the conductive layer; and
removing a portion of the third dielectric layer and the first dielectric layer above the openings to form a plurality of self-aligned contact holes.

2. The method of forming a contact hole of claim 1, wherein the etching selectivity of the conductive layer to the spacer protection layer is from about 40 to about 140.

3. The method of forming a contact hole of claim 1, wherein the etching selectivity of the conductive layer to the spacer material layer is from about 5 to about 20.

4. The method of forming a contact hole of claim 1, wherein the etching selectivity of the spacer material layer to the spacer protection layer is from about 2 to about 28.

5. The method of forming a contact hole of claim 1, wherein a material of the conductive layer is polysilicon or doped polysilicon.

6. The method of forming a contact hole of claim 1, wherein a material of the spacer material layer is silicon nitride.

7. The method of forming a contact hole of claim 1, wherein a material of the spacer protection layer is silicon oxide.

8. The method of forming a contact hole of claim 1, wherein the device structures comprise a plurality of trench-type structures partially formed in the substrate, or a plurality of device structures totally formed over the surface of the substrate.

9. The method of forming a contact hole of claim 1, wherein the device structures comprise a plurality of gate structures or a plurality of conductive line structures.

10. The method of forming a contact hole of claim 1, wherein a method of forming the second dielectric layer comprises:
forming a dielectric material layer over the substrate; and
performing an anisotropic etch process to retain the dielectric material layer on the sidewalls of the openings.

11. The method of forming a contact hole of claim 1, wherein in the composite spacers the spacer protection layer is formed in a recess of the spacer material layer.

12. The method of forming a contact hole of claim 1, wherein a material of the first dielectric layer is silicon oxide or silicon oxide/silicon nitride/silicon oxide.

13. The method of forming a contact hole of claim 1, wherein a material of the second dielectric layer is silicon nitride.

14. The method of forming a contact hole of claim 1, wherein a material of the third dielectric layer is silicon oxide.

15. A method of fabricating a semiconductor device, comprising:
providing a substrate, a plurality of device structures being formed over the substrate, a first dielectric layer and a conductive layer sequentially covering the device structures and a surface of the substrate, a plurality of first doped regions being formed at the bottom of the device structures, the conductive layer comprising a recess between every two neighboring device structures;

forming a pair of composite spacers in the recess, the composite spacers comprising a spacer material layer and a spacer protection layer disposed over the spacer material layer, an etching selectivity of the conductive layer to the spacer protection layer being larger than an etching selectivity of the conductive layer to the spacer material layer;

removing a portion of the conductive layer by using the composite spacers as a mask to form a plurality of openings to expose the substrate in the conductive layer between the neighboring device structures;

forming a plurality of second doped regions in the substrate at the bottom of the openings;

forming a second dielectric layer on sidewalls of the openings;

forming a third dielectric layer over the substrate, the third dielectric layer covering the device structures and the conductive layer;

removing a portion of the third dielectric layer and the first dielectric layer above the openings to form a plurality of self-aligned contact holes; and forming a plurality of conductive plugs in the self-aligned contact holes.

16. The method of fabricating a semiconductor device of claim 15, wherein the etching selectivity of the conductive layer to the spacer protection layer is from about 40 to about 140.

17. The method of fabricating a semiconductor device of claim 15, wherein the etching selectivity of the conductive layer to the spacer material layer is from about 5 to about 20.

18. The method of fabricating a semiconductor device of claim 15, wherein the etching selectivity of the spacer material layer to the spacer protection layer is from about 2 to about 28.

19. The method of fabricating a semiconductor device of claim 15, wherein a material of the conductive layer is polysilicon or doped polysilicon.

20. The method of fabricating a semiconductor device of claim 15, wherein a material of the spacer material layer is silicon nitride.

21. The method of fabricating a semiconductor device of claim 15, wherein a material of the spacer protection layer is silicon oxide.

22. The method of fabricating a semiconductor device of claim 15, wherein the device structures comprise a plurality of trench-type structures partially formed in the substrate, or a plurality of device structures totally formed over the surface of the substrate.

23. The method of fabricating a semiconductor device of claim 15, wherein the device structures comprise a plurality of gate structures or a plurality of conductive line structures.

24. The method of fabricating a semiconductor device of claim 15, wherein in the composite spacers the spacer protection layer is formed in a recess of the spacer material layer.

25. The method of fabricating a semiconductor device of claim 15, wherein a material of the first dielectric layer is silicon oxide or silicon oxide/silicon nitride/silicon oxide.

26. The method of fabricating a semiconductor device of claim 15, wherein a material of the second dielectric layer is silicon nitride.

27. The method of fabricating a semiconductor device of claim 15, wherein a material of the third dielectric layer is silicon oxide.

28. The method of fabricating a semiconductor device of claim 15, wherein the first doped regions are source regions, and the second doped regions are drain regions.

* * * * *